United States Patent
Shen

(10) Patent No.: US 6,967,890 B2
(45) Date of Patent: Nov. 22, 2005

(54) BATTERY POWER MEASURING SYSTEM AND METHOD FOR A BATTERY-BACKED SRAM

(75) Inventor: Cheng Yin Shen, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/997,161

(22) Filed: Nov. 24, 2004

(65) Prior Publication Data

US 2005/0134226 A1 Jun. 23, 2005

(30) Foreign Application Priority Data

Dec. 19, 2003 (TW) .............................. 92136190 A

(51) Int. Cl.$^7$ ............................................... G11C 7/00
(52) U.S. Cl. ..................... 365/226; 365/227; 320/132; 711/118
(58) Field of Search .............................. 365/226, 227; 320/132; 711/118

(56) References Cited

U.S. PATENT DOCUMENTS

| | | | |
|---|---|---|---|
| 5,323,354 A | * | 6/1994 | Matsumoto et al. ........ 365/229 |
| 5,375,246 A | * | 12/1994 | Kimura et al. .............. 365/229 |
| 6,329,796 B1 | | 12/2001 | Popescu |
| 2003/0193318 A1 | | 10/2003 | Ozawa et al. |

* cited by examiner

Primary Examiner—Anh Phung
Assistant Examiner—N Nguyen
(74) Attorney, Agent, or Firm—Wei Te Chung

(57) ABSTRACT

A battery power measuring system for a Battery-Backed SRAM includes a nonvolatile memory (11), a clock (12), a CPU (10) and a buzzer (13). The nonvolatile memory is for storing a system time, an estimated battery maximal endurance, an estimated battery minimal endurance, and a cumulative on-battery run time. The clock is for indicating the current system time. The CPU is for calculating a new cumulative on-battery run time and a remaining battery endurance. The buzzer is for reminding users to replace a battery when the remaining battery endurance is lower than the estimated battery minimal endurance. The CPU is connected to the nonvolatile memory, the clock, and the buzzer through a plurality of data buses (14). A related battery power measuring method is also provided.

13 Claims, 3 Drawing Sheets

BATTERY POWER MEASURING SYSTEM AND METHOD FOR A BATTERY-BACKED SRAM

BACKGROUND OF THE INVENTION

1. Field of the Invention

The present invention relates to battery power measuring systems and methods, and particularly to a battery power measuring system and method for a Battery-Backed SRAM (Static Random Access Memory).

2. Background of the Invention

A RAM (Random Access Memory) is one of the most important components in a typical computer, and is controlled by a CPU (Central Processing Unit). The close relationship between the RAM and the CPU is akin to the relationship between thinking and memory in a human. Data and instructions which are to be processed or are being processed by the CPU are stored in the RAM. The RAM is a volatile memory. That is, the RAM depends on ongoing electrical power to enable it to store data. The data is lost when there is no electrical power supplied to the RAM. Therefore, a so-called Battery-Backed SRAM (Static Random Access Memory) is becoming increasing popular. The Battery-Backed SRAM guarantees a continuous source of electrical power by supplying battery power in the event that a primary power source fails or is unavailable. The Battery-Backed SRAM is comprised of an SRAM and an internal battery. The Battery-Backed SRAM generally receives electrical power from the primary power source, and occasionally receives electrical power from the internal battery when the primary power source fails or becomes unavailable.

The power of the internal battery is limited. Knowing the exact amount of power remaining in the internal battery is critical to guaranteeing reliability of the Battery-Backed SRAM. There are many means for measuring the length of time that a battery's power will last before it runs out. This length of time is referred to herein as "endurance." Many of said means measure remaining endurance based on input received from detection devices or detection circuits. For example, China Pat. No. 1063769 issued on Aug. 19, 1992 and entitled "Battery Power Monitor For Personal Computer" discloses a processor that receives and processes parameters from detection devices, and then measures remaining battery power according to a preset battery power table. The parameters include battery current, battery voltage, and battery temperature. The preset battery power table provides a remaining battery power value based on the received battery current, battery voltage and battery temperature. In another example, Taiwan Pat. No. 0911118 Sep. 21, 2003 and entitled "Methods And Systems For Noticing Battery Power Deficiency On Portable Electrical Device" discloses a special circuit to determine a battery voltage. The circuit compares the battery voltage with a threshold voltage, and notifies users if the battery voltage is lower than the threshold voltage.

The monitor of the above China patent needs current detection circuits, voltage detection circuits and temperature detection circuits, and the methods and systems of the above Taiwan patent need special circuitry and logistic transistors. All these means require the addition of electronic control devices to the battery. These additional components increase the respective system's design, development and implementation costs, as well as the ultimate cost of the product to the customer. Furthermore, such hardware specific means are not easily transported from one platform and computer system to another without major redesign. In other words, the solutions lack portability. A battery power measuring system and method for a Battery-Backed SRAM which can overcome the above-mentioned problems is desired.

SUMMARY OF THE INVENTION

Accordingly, a main objective of the present invention is to provide a system and method for simply and conveniently measuring battery power for a Battery-Backed SRAM.

To accomplish the above objective, a battery power measuring system for a Battery-Backed SRAM in accordance with a preferred embodiment of the present invention comprises a nonvolatile memory, a clock, a CPU and a buzzer.

The nonvolatile memory is used for storing a system time, an estimated battery maximal endurance, an estimated battery minimal endurance and a cumulative on-battery run time, and may be a flash memory, an EPROM (Erasable And Programmable Read-Only Memory), or an EEPROM (Electrically Erasable Programmable Read-Only Memory).

The clock is provided for indicating a current system time. The CPU calculates a new cumulative on-battery run time based on a former system time, an estimated battery maximal endurance, a former cumulative on-battery run time, and a current system time. The CPU also calculates a remaining battery endurance by deducting the new cumulative on-battery run time from the estimated battery maximal endurance. The buzzer is used for generating a warning sound to remind users to replace the battery when the remaining battery endurance is lower than the estimated battery minimal endurance.

Further, the present invention provides a method for measuring battery power, the method comprising the steps of: (a) providing a nonvolatile memory for storing a system time, an estimated battery maximal endurance, an estimated battery minimal endurance and a cumulative on-battery run time; (b) providing a clock for indicating a current system time; (c) calculating a new cumulative on-battery run time according to a former system time, a former cumulative on-battery run time and the current system time; (d) calculating a remaining battery endurance according to the estimated battery maximal endurance and the new cumulative on-battery run time; (e) determining whether the remaining battery endurance is lower than the estimated battery minimal endurance; (f) providing a buzzer and triggering the buzzer to remind users to replace the battery if the remaining battery endurance is lower than the estimated battery minimal endurance; (g) storing the current system time in the nonvolatile memory; (h) determining whether the primary power source is unavailable; and (i) storing the current system time in the nonvolatile memory if the primary power source is available and still powering.

In summary, the battery power measuring system and method for a Battery-Backed SRAM are easy to implement and cost efficient, because the system and method avoid the need to implement specialized hardware such as voltage detection circuits, current detection circuits, temperature detection circuits, logistic transistors, and the like. The system and method measure battery power in accordance with a cumulative on-battery run time and a remaining battery endurance, and triggers a buzzer to remind users to replace the battery when needed.

Other objects, advantages and novel features of the present invention will be drawn from the following detailed description with reference to the attached drawings, in which:

DETAILED DESCRIPTION OF THE INVENTION

Figure 1:
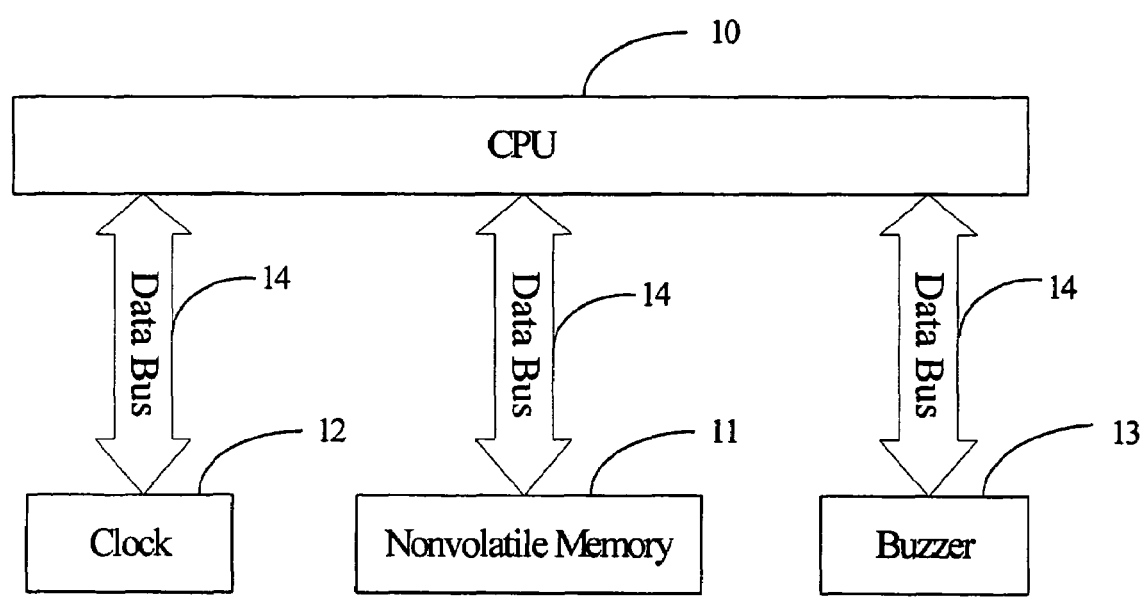
FIG. 1 is a schematic diagram of hardware infrastructure of a battery power measuring system for a Battery-Backed SRAM in accordance with the preferred embodiment of the present invention.

FIG. 1 is a schematic diagram of hardware infrastructure of a battery power measuring system (hereinafter, "the system") for a Battery-Backed SRAM (Static Random Access Memory) in accordance with the preferred embodiment of the present invention. Normally, the system and an SRAM thereof are energized by a primary power source. When the primary power source is temporarily unavailable, or when a sudden power outage occurs, the SRAM depends on a battery (not shown) connected thereto for supply of power. The primary power source may for example supply alternating current power. The primary power source may be a remote source such as a utility company, or may be a local source such as a generator powered by combustible fuel.

The system comprises a nonvolatile memory 11, a clock 12, a CPU (Central Processing Unit) 10, a buzzer 13, and a plurality of data buses 14. The CPU 10 is connected to the nonvolatile memory 11, the clock 12 and the buzzer 13 through the data buses 14. The nonvolatile memory 11 stores a system time, an estimated battery maximal endurance, an estimated battery minimal endurance, and a cumulative on-battery run time. The system time is a current time indicated by the clock 12. The estimated battery maximal endurance is a maximum amount of time that the battery with a full charge can last before it runs out. The estimated battery minimal endurance is a minimum amount of time that the battery with a remaining charge can last before it runs out. Users need to replace the battery with a new one when a remaining charge of the battery becomes less than the estimated battery minimal endurance, in order to ensure that battery power is always available for the SRAM. The cumulative on-battery run time is the cumulative amount of time that the Battery-Backed SRAM has been supported by the battery. The system time and the cumulative on-battery run time are variable. The estimated battery maximal endurance and the estimated battery minimal endurance are fixed values, and can be calculated by respective formulas. The nonvolatile memory 11 may be a flash memory, an EPROM (Erasable And Programmable Read-only Memory), or an EEPROM (Electrically Erasable Programmable Read-only Memory). The clock 12 indicates the current system time. The CPU 10 calculates a new cumulative on-battery run time based on a former system time, a former cumulative on-battery run time, and a current system time. The former system time is the time when a latest power failure occurred. The CPU 10 also calculates a remaining battery endurance by deducting the new cumulative on-battery run time from the estimated battery maximal endurance. The buzzer 13 generates a warning sound to remind users to replace the battery when the remaining battery endurance is lower than the estimated battery minimal endurance.

Figure 2:
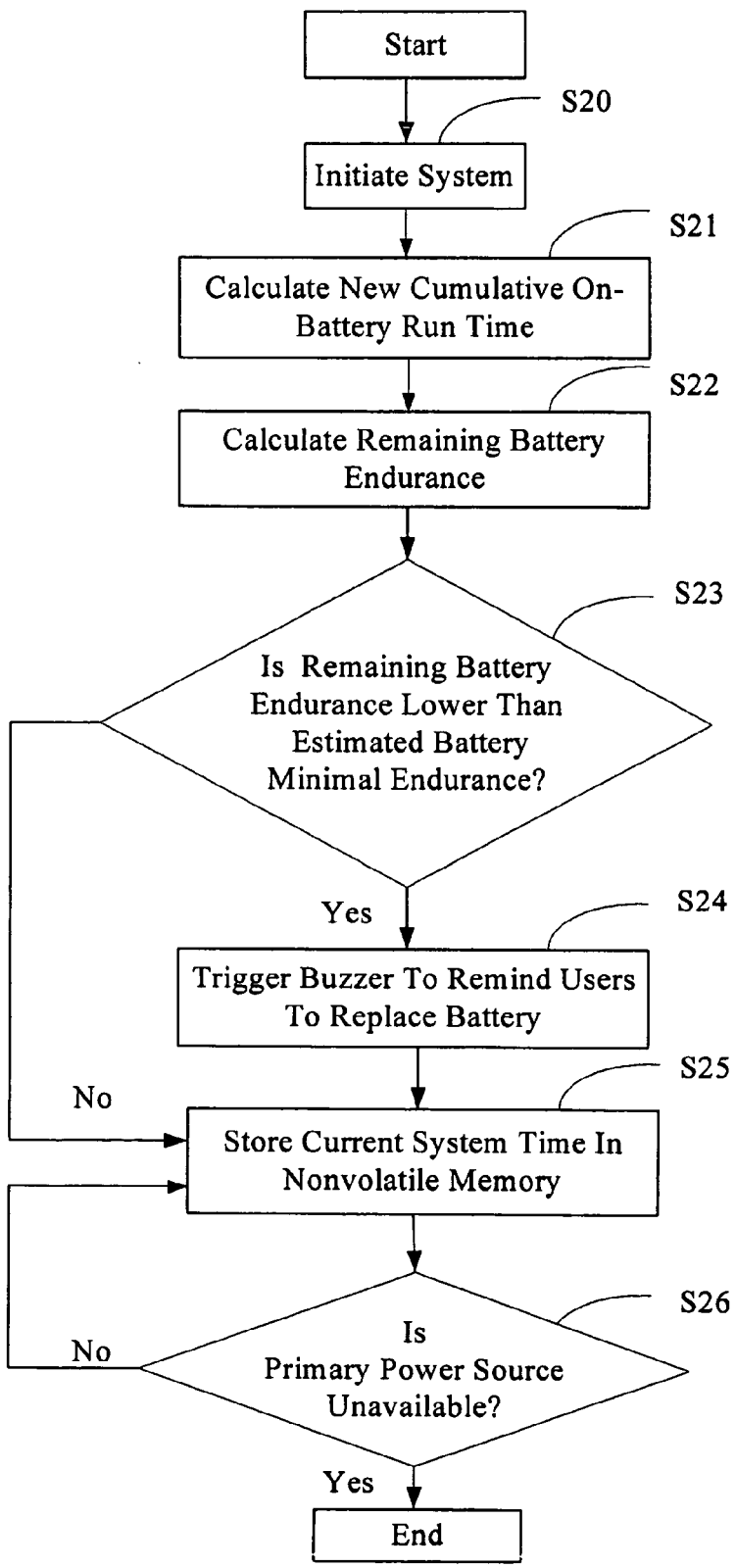
FIG. 2 is a flowchart of a preferred method for measuring battery power for a Battery-Backed SRAM according to the present invention, utilizing the system of FIG. 1.

FIG. 2 is a flowchart of a preferred method for measuring battery power for a Battery-Backed SRAM according to the present invention, utilizing the above-described system. In step S20, the system is initiated and powered by a primary power source. In step S21, the CPU 10 calculates a new cumulative on-battery run time for the Battery-Backed SRAM according to a formula based on a former cumulative on-battery run time, a current system time, and a former system time. This calculation is described in more detail below in relation to FIG. 3. The CPU 10 stores the new cumulative on-battery run time in the nonvolatile memory 11. In step S22, the CPU 10 calculates a remaining battery endurance for the Battery-Backed SRAM according to another formula based on an estimated battery maximal endurance and the new cumulative on-battery run time. This calculation is described in more detail below in relation to FIG. 4. In step S23, the CPU 10 determines whether the remaining battery endurance is lower than a corresponding estimated battery minimal endurance. If the remaining battery endurance is not lower than the estimated battery minimal endurance, the procedure goes directly to step S25 described below. If the remaining battery endurance is lower than the estimated battery minimal endurance, in step S24, the CPU 10 triggers the buzzer 12 to remind users to replace the battery. In step S25, the CUP 10 stores the current system time in the nonvolatile memory 11. In step S26, the CPU 10 determines whether the primary power source is unavailable. If the primary power source is unavailable, the procedure is ended. The battery begins to power the SRAM. The current system time stored in the nonvolatile memory 11 is recorded as the former system time when the system is initiated next time by the primary power source. If the primary power source is available and still powering the system, the procedure returns to step S25 described above.

Figure 3:
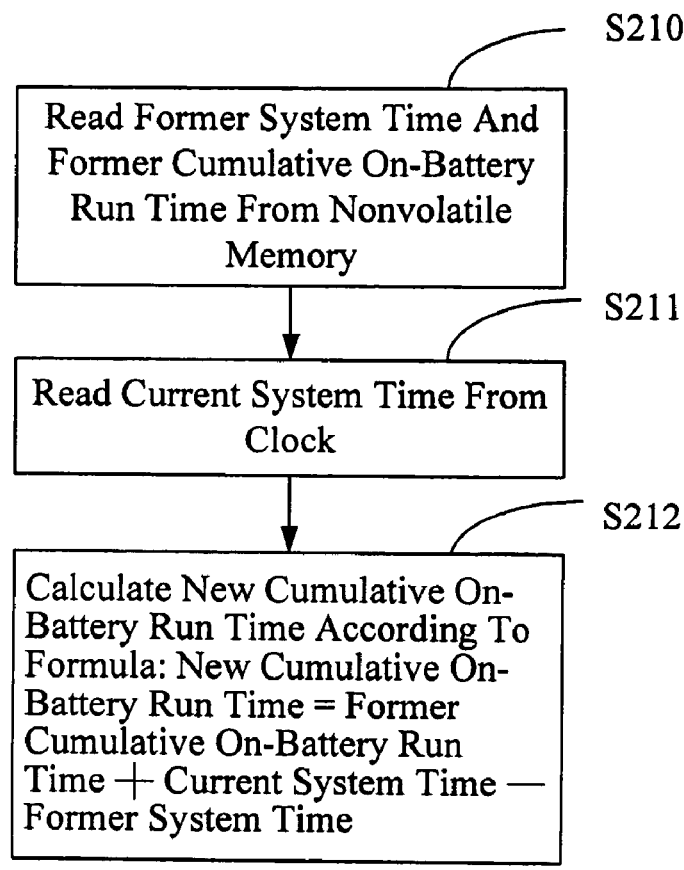
FIG. 3 is a flowchart of implementing one step of FIG. 2, namely calculating a new cumulative on-battery run time for the Battery-Backed SRAM.

FIG. 3 is a flowchart of implementing step S21 of FIG. 2, namely calculating the new cumulative on-battery run time for the Battery-Backed SRAM. In step S210, the CPU 10 reads the former system time and the former cumulative on-battery run time from the nonvolatile memory 11 through one of the data buses 14. In step S211, the CPU 11 reads the current system time from the clock 12 through another data bus 14. In step S212, the CPU 10 calculates the new cumulative on-battery run time according to the following formula: new cumulative on-battery run time=former cumulative on-battery run time+current system time−former system time.

Figure 4:
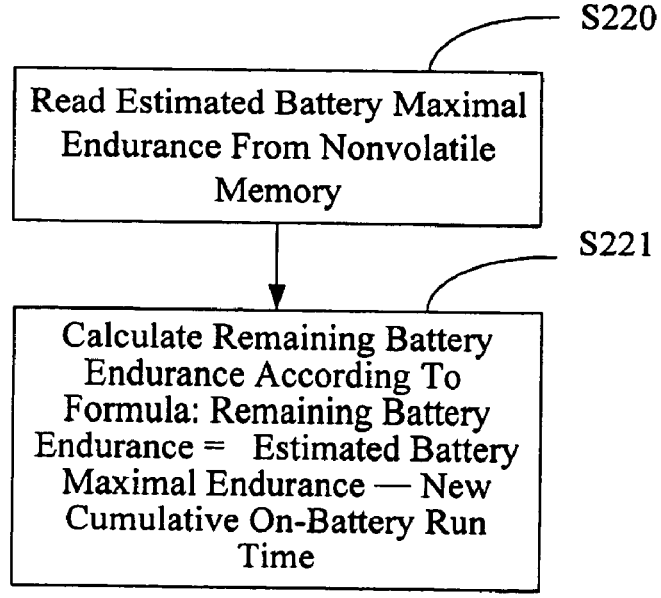
FIG. 4 is a flowchart of implementing another step of FIG. 2, namely calculating a remaining battery endurance for the Battery-Backed SRAM.

FIG. 4 is a flowchart of implementing step S22 of FIG. 2, namely calculating the remaining battery endurance for the Battery-Backed SRAM. In step S220, the CPU 10 reads the corresponding estimated battery maximal endurance from the nonvolatile memory 11 through one of the data buses 14. In step S221, the CPU 10 calculates the remaining battery endurance according to the following formula: remaining battery endurance=estimated battery maximal endurance−cumulative on-battery run time.

In summary, the battery power measuring system and method for a Battery-Backed SRAM are easy to implement and cost efficient, because the system and method avoid the need to implement specialized hardware such as voltage detection circuits, current detection circuits, temperature detection circuits, logistic transistors and the like. The system and method measure battery power in accordance with a cumulative on-battery run time and a remaining battery endurance, and trigger a buzzer to remind users to replace the battery when needed.

Although the present invention has been specifically described on the basis of a preferred embodiment and preferred method, the invention is not to be construed as being limited thereto. Various changes or modifications may be made to the embodiment and method without departing from the scope and spirit of the invention.

What is claimed is:

1. A battery power measuring system for a Battery-Backed SRAM (Static Random Access Memory), comprising:
   a nonvolatile memory for storing a system time, an estimated battery maximal endurance, an estimated battery minimal endurance, and a cumulative on-battery run time;
   a clock for indicating a current system time;
   a CPU (Central Processing Unit) for calculating a new cumulative on-battery run time based on a former system time, the estimated battery maximal endurance and a former cumulative on-battery run time, and for calculating a remaining battery endurance according to the estimate battery maximal endurance and the new cumulative on-battery run time; and
   a buzzer for reminding one or more users to replace a battery when the remaining battery endurance is lower than the estimated battery minimal endurance.

2. The battery power measuring system for a Battery-Backed SRAM according to claim 1, wherein the CPU is connected to the nonvolatile memory, the clock and the buzzer through a plurality of data buses.

3. The battery power measuring system for a Battery-Backed SRAM according to claim 1, wherein the nonvolatile memory is a flash memory.

4. The battery power measuring system for a Battery-Backed SRAM according to claim 1, wherein the nonvolatile memory is an EPROM (Erasable And Programmable Read-Only Memory).

5. The battery power measuring system for a Battery-Backed SRAM according to claim 1, wherein the nonvolatile memory is an EEPROM (Electrically Erasable Programmable Read-Only Memory).

6. The battery power measuring system for a Battery-Backed SRAM according to claim 1, wherein the CPU calculates the new cumulative on-battery run time according to the formula: new cumulative on-battery run time=former cumulative on-battery run time+current system time−former system time.

7. The battery power measuring system for a Battery-Backed SRAM according to claim 1, wherein the CPU calculates the remaining battery endurance according to the formula: remaining battery endurance=estimated battery maximal endurance−new cumulative on-battery run time.

8. A battery power measuring method for a Battery-Backed SRAM, comprising the steps of:
   providing a nonvolatile memory for storing a system time, an estimated battery maximal endurance, an estimated battery minimal endurance and a cumulative on-battery run time;
   providing a clock for indicating a current system time;
   calculating a new cumulative on-battery run time according to a former system time, a former cumulative on-battery run time, and the current system time;
   calculating a remaining battery endurance according to the estimated battery maximal endurance and the new cumulative on-battery run time;
   determining whether the remaining battery endurance is lower than the estimated battery minimal endurance;
   providing a buzzer and triggering the buzzer to remind one or more users to replace the battery if the remaining battery endurance is lower than the estimated battery minimal endurance;
   storing the current system time in the nonvolatile memory;
   determining whether a primary power source is unavailable; and
   storing the current system time in the nonvolatile memory if the primary power source is available and still powering.

9. The method according to claim 8, further comprising the step of directly storing the current system time in the nonvolatile memory when the remaining battery endurance is not lower than the estimated battery minimal endurance.

10. The method according to claim 8, further comprising the step of terminating the procedure when the primary power source is unavailable.

11. The method according to claim 8, wherein the step of calculating the new cumulative on-battery run time comprises the steps of:
   reading the former system time and the former cumulative on-battery run time from the nonvolatile memory;
   reading the current system time from the clock; and
   calculating the new cumulative on-battery run time according to the formula: new cumulative on-battery run time=former cumulative on-battery run time+current system time−former system time.

12. The method according to claim 8, wherein the step of calculating the remaining battery endurance comprises the steps of:
   reading the estimated battery maximal endurance from the nonvolatile memory; and
   calculating the remaining battery endurance according to the formula: remaining battery endurance=estimated battery maximal endurance−new cumulative on-battery run time.

13. A battery power measuring method for a Battery-Backed SRAM, comprising the steps of:
   providing a nonvolatile memory for storing a system time, an estimated battery maximal endurance, an estimated battery minimal endurance and a cumulative on-battery run time;
   providing a clock for indicating a current system time;
   calculating a new cumulative on-battery run time according to a formula: the new cumulative on-battery run time=a former cumulative on-battery run time+a current system time−a former system time;
   calculating a remaining battery endurance according to a formula: the remaining battery endurance=the estimated battery maximal endurance−the new cumulative on-battery run time; and
   sending a warning signal if the remaining battery endurance is lower than the estimated battery minimal endurance; wherein
   no testing is required through any hardware.

* * * * *